(12) United States Patent
VanGilder et al.

(10) Patent No.: US 11,997,833 B2
(45) Date of Patent: May 28, 2024

(54) IT-ROOM-COOLING-PERFORMANCE ASSESSMENT

(71) Applicant: SCHNEIDER ELECTRIC IT CORPORATION, Foxboro, MA (US)

(72) Inventors: James William VanGilder, Pepperell, MA (US); Michael B. Condor, Chelmsford, MA (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 0 days.

(21) Appl. No.: 17/457,468

(22) Filed: Dec. 3, 2021

(65) Prior Publication Data

US 2022/0183191 A1 Jun. 9, 2022

Related U.S. Application Data

(60) Provisional application No. 63/121,275, filed on Dec. 4, 2020.

(51) Int. Cl.
*G06F 1/20* (2006.01)
*H05K 7/20* (2006.01)

(52) U.S. Cl.
CPC ......... *H05K 7/20836* (2013.01); *G06F 1/206* (2013.01); *H05K 7/20745* (2013.01)

(58) Field of Classification Search
CPC ..................................................... G06F 1/206
See application file for complete search history.

(56) References Cited

U.S. PATENT DOCUMENTS 6,374,627 B1  4/2002  Schumacher et al.
6,574,104 B2  6/2003  Patel et al.
(Continued)

FOREIGN PATENT DOCUMENTS

AU  2010245857 A1 * 11/2011 ............. G06F 15/00
WO  2006119248 A2  11/2006
WO  WO-2016130453 A1 * 8/2016 ......... H05K 7/20745

OTHER PUBLICATIONS

Extended European Search Report from corresponding European Application No. 21212322.8 dated Apr. 29, 2022.
(Continued)

*Primary Examiner* — Suresh Suryawanshi
(74) *Attorney, Agent, or Firm* — Lando & Anastasi, LLP

(57) ABSTRACT

According to at least one aspect of the present disclosure, an information-technology-design system is provided comprising at least one processor coupled to at least one memory, wherein the at least one processor is configured to receive information-technology-device information indicative of a plurality of information-technology devices in a space, the information-technology-device information including information-technology-device-location information, temperature information, and capture-index information, determine, based on the information-technology-device information, a containment type of the plurality of information-technology devices, select, based on the containment type, at least a portion of the capture-index information, determine, based on the information-technology-device-location information, the temperature information, and the at least the portion of the capture-index information, a respective cooling-performance assessment for each information-technology device of the plurality of information-technology devices, and display an indicator of the respective cooling-performance assessment for each information-technology device of the plurality of information-technology devices in the space.

21 Claims, 6 Drawing Sheets

(56) References Cited

U.S. PATENT DOCUMENTS

| | | |
|---|---|---|
| 6,718,277 B2 | 4/2004 | Sharma |
| 8,639,482 B2 | 1/2014 | Rasmussen et al. |
| 8,712,735 B2 | 4/2014 | VanGilder et al. |
| 8,725,307 B2 | 5/2014 | Healey et al. |
| 8,972,217 B2 | 3/2015 | VanGilder et al. |
| 9,418,179 B2 | 8/2016 | Zhang et al. |
| 9,494,985 B2* | 11/2016 | Rasmussen ............. G06F 30/13 |
| 10,157,245 B2 | 12/2018 | VanGilder et al. |
| 10,210,288 B2 | 2/2019 | Healey et al. |
| 2005/0267639 A1 | 12/2005 | Sharma et al. |
| 2006/0121421 A1 | 6/2006 | Spitaels et al. |
| 2007/0038414 A1 | 2/2007 | Rasmussen et al. |
| 2008/0041076 A1 | 2/2008 | Tutunoglu et al. |
| 2008/0174954 A1* | 7/2008 | VanGilder .......... H05K 7/20745 361/679.54 |
| 2009/0138313 A1* | 5/2009 | Morgan ............... H05K 7/2079 705/7.23 |
| 2009/0207564 A1 | 8/2009 | Campbell et al. |
| 2012/0158375 A1 | 6/2012 | Healey |
| 2012/0158387 A1* | 6/2012 | VanGilder ............... G06F 30/20 703/9 |
| 2014/0358471 A1* | 12/2014 | VanGilder ............. G01K 1/024 702/130 |
| 2019/0155268 A1 | 5/2019 | Cohen et al. |
| 2022/0151109 A1* | 5/2022 | VanGilder .......... H05K 7/20145 |

OTHER PUBLICATIONS

Bash, Cullen E. et al., "Efficient Thermal Management of Data Centers—Immediate and Long-Term Research Needs," vol. 9, No. 2, HVAC&R Research, Apr. 2003, pp. 1-16.

Herrlin, Magnus K., Rack Cooling Effectiveness in Data Centers and Telecom Central Offices: The Rack Cooling Index (RCI)TM, DE-05-11-2, 2005, American Society of Heating, Refrigerating and Air-Conditioning Engineers, Inc. Reprinted by permission from ASHRAE Transactions, vol. 111, Part 2, pp. 1-11.

VanGilder, James et al., "A Compact Rack Model for Data Center CFD Modeling," 19th IEEE ITHERM Conference, 2020 IEEE, pp. 350-356.

VanGilder, James W. et al., "Capture Index: An Airflow-Based Rack Cooling Performance Metric," 2007, American Society of Heating, Refrigerating and Air-Conditioning Engineers, Inc. [www.ashrae.org), Published in ASHRAE Transactions 2007, vol. 113, Part 1, DA-07-014, pp. 126-136.

* cited by examiner

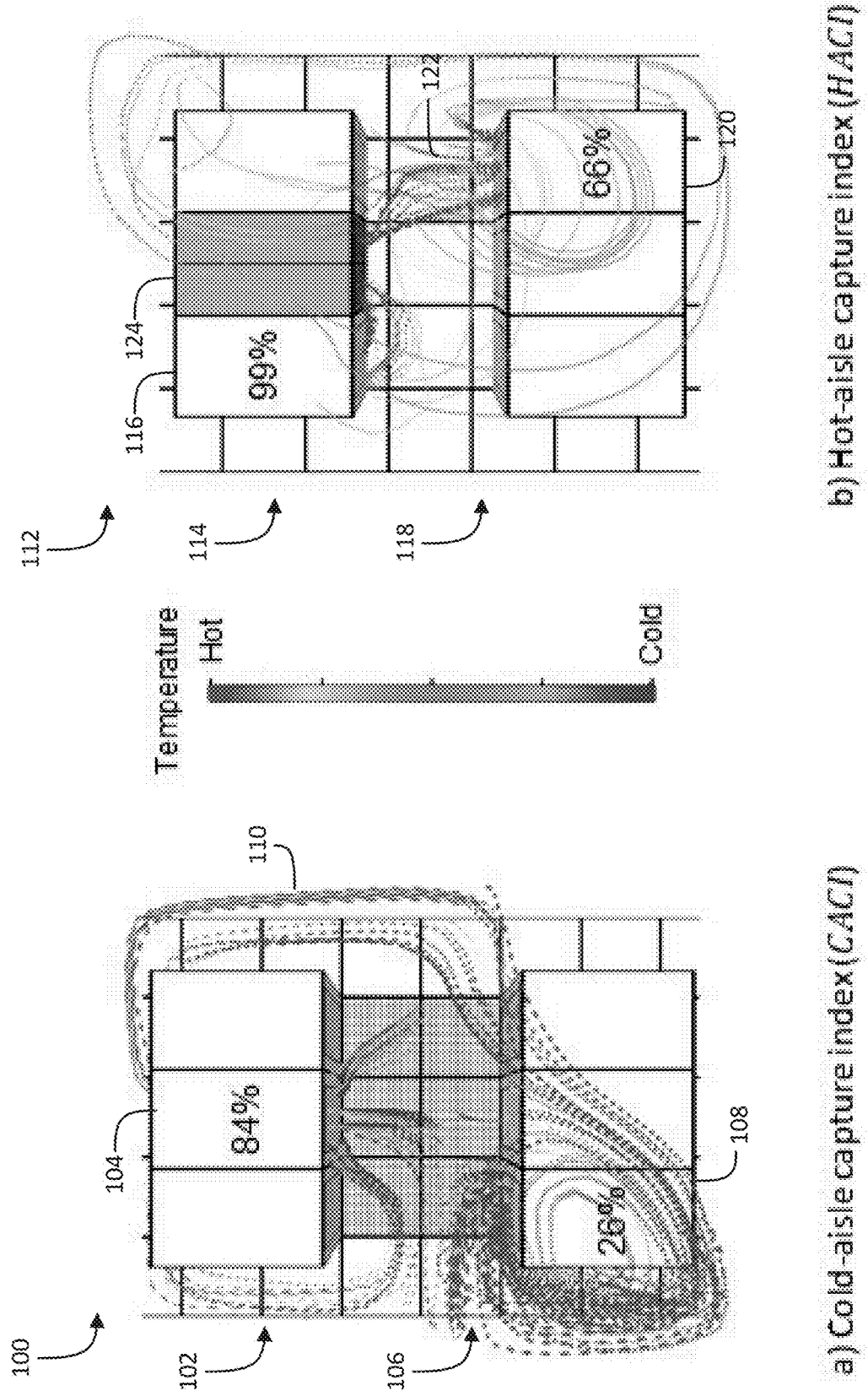

a) Cooling Performance Assessment b) Cooling Performance Assessment with Velocity Vectors

IT-ROOM-COOLING-PERFORMANCE ASSESSMENT

CROSS-REFERENCE TO RELATED APPLICATIONS

This application claims priority under 35 U.S.C. § 119(e) to U.S. Provisional Application Ser. No. 63/121,275, titled "IT-ROOM-COOLING-PERFORMANCE ASSESSMENT," filed on Dec. 4, 2020, which is hereby incorporated by reference in its entirety.

BACKGROUND

1. Field of the Disclosure

At least one example in accordance with the present disclosure relates generally to information-technology-room cooling.

2. Discussion of Related Art

Data centers often include computer servers and power-supply devices to provide power to the servers. Computer servers and power-supply devices generate heat when operating. Consequently, many data centers include cooling devices to cool the computer servers and/or power-supply devices. The cooling devices may regulate a temperature in the data center such that a temperature of the computer servers and/or power-supply devices is controllable.

SUMMARY

According to at least one aspect of the present disclosure, an information-technology-design system is provided comprising at least one processor coupled to at least one memory, wherein the at least one processor is configured to receive information-technology-device information indicative of a plurality of information-technology devices in a space, the information-technology-device information including information-technology-device-location information, temperature information, and capture-index information, determine, based on the information-technology-device information, a containment type of the plurality of information-technology devices, select, based on the containment type, at least a portion of the capture-index information, determine, based on the information-technology-device-location information, the temperature information, and the at least the portion of the capture-index information, a respective cooling-performance assessment for each information-technology device of the plurality of information-technology devices, and display an indicator of the respective cooling-performance assessment for each information-technology device of the plurality of information-technology devices in the space.

In some examples, the temperature information is indicative of an inlet temperature of air drawn by the plurality of information-technology devices. In various examples, the capture-index information includes at least one of a cold-aisle capture index (CACI) or a hot-aisle capture index (HACI). In at least one example, the CACI is indicative of a percentage of cooling airflow provided to a respective information-technology device by a cooling resource. In some examples, the HACI is indicative of a percentage of output airflow provided by a respective information-technology device to a cooling resource. In various examples, the containment type is one of an uncontained type, a hot-and-cold-aisle containment type, a hot-aisle containment type, or a cold-aisle containment type.

In at least one example, the capture-index information includes at least one of a cold-aisle capture index (CACI) or a hot-aisle capture index (HACI), and selecting the at least the portion of the capture-index information based on the containment type includes selecting at least one of the CACI or the HACI based on the containment type being the uncontained type, the hot-and-cold-aisle containment type, the hot-aisle containment type, or the cold-aisle containment type. In some examples, the at least one processor is configured to determine the cooling-performance assessment based on a greater of the CACI and the HACI responsive to determining that the containment type is the uncontained type. In various examples, the at least one processor is configured to determine the cooling-performance assessment based on a lesser of the CACI and the HACI responsive to determining that the containment type is the hot-and-cold-aisle containment type.

In at least one example, the at least one processor is configured to determine the cooling-performance assessment based on the HACI responsive to determining that the containment type is the hot-aisle containment type. In some examples, the at least one processor is configured to determine the cooling-performance assessment based on the CACI responsive to determining that the containment type is the cold-aisle containment type. In various examples, the at least one processor further is configured to display the respective indicator of the cooling-performance assessment for each respective information-technology device of the plurality of information-technology devices with a view of at least one of a simulated airflow or a temperature gradient in the space.

In at least one example, each respective indicator of the cooling-performance assessment includes a respective cooling-performance classification of each information-technology device of the plurality of information-technology devices, and the at least one processor is further configured to provide a view of the plurality of information-technology devices in the space and, for each information-technology device, a representation of a respective cooling-performance classification. In some examples, the at least one processor further is configured to output the cooling-performance assessment with a view of at least one of a simulated airflow or a temperature gradient in the space with the representation of the respective cooling-performance classification for each information-technology device.

According to at least one aspect of the disclosure, a non-transitory computer-readable medium storing thereon sequences of computer-executable instructions for assessing a space containing a plurality of information-technology devices is provided, the sequences of computer-executable instructions including instructions that instruct at least one processor to receive information-technology-device information indicative of the plurality of information-technology devices in the space, the information-technology-device information including information-technology-device-location information, temperature information, and capture-index information, determine, based on the information-technology-device information, a containment type of the plurality of information-technology devices, select, based on the containment type, at least a portion of the capture-index information, determine, based on the information-technology-device-location information, the temperature information, and the at least the portion of the capture-index information, a respective cooling-performance assessment for each information-technology device of the plurality of information-technology devices in the space, and display an indicator of the respective cooling-performance assessment for each information-technology device of the plurality of information-technology devices in the space.

In some examples, the capture-index information includes at least one of a cold-aisle capture index (CACI) or a hot-aisle capture index (HACI), and selecting the at least the portion of the capture-index information based on the containment type includes selecting at least one of the HACI or the CACI. In various examples, the instructions further instruct the at least one processor to determine the cooling-performance assessment based on a greater of the CACI and the HACI responsive to determining that the containment type is an uncontained type. In at least one example, the instructions further instruct the at least one processor to determine the cooling-performance assessment based on a lesser of the CACI and the HACI responsive to determining that the containment type is a hot-and-cold-aisle containment type. In some examples, the instructions further instruct the at least one processor to determine the cooling-performance assessment based on the HACI responsive to determining that the containment type is a hot-aisle containment type, and determine the cooling-performance assessment based on the CACI responsive to determining that the containment type is a cold-aisle containment type.

According to at least one aspect of the disclosure, a method for assessing a space containing a plurality of information-technology devices is provided, the method comprising receiving information-technology-device information indicative of the plurality of information-technology devices in the space, the information-technology-device information including information-technology-device-location information, temperature information, and capture-index information, determining, based on the information-technology-device information, a containment type of the plurality of information-technology devices, selecting, based on the containment type, at least a portion of the capture-index information, determining, based on the information-technology-device-location information, the temperature information, and the at least the portion of the capture-index information, a respective cooling-performance assessment for each information-technology device of the plurality of information-technology devices in the space, and displaying an indicator of the respective cooling-performance assessment for each information-technology device of the plurality of information-technology devices in the space.

At least one example in accordance with the present disclosure relates generally to cooling-performance assessments and, in some examples, information technology (IT)-room-cooling-performance assessments. An IT room may include any space including IT equipment, such as a data center, a space containing uninterruptible power supplies (UPSs), or other spaces containing IT equipment. An IT room may include one or more computing components. It may be desirable to control a temperature in an IT room. For example, it may be desirable to provide cooling equipment in an IT room.

According to at least one aspect of the present disclosure, a system is provided comprising at least one processor coupled to at least one memory, wherein the at least one processor is configured to receive object information indicative of physical objects in a space, the object information including object-location information and at least one of temperature information or capture-index information, determine, based on the object information, at least one of a temperature assessment or a capture-index assessment, and determine, based on the at least one of the temperature assessment or the capture-index assessment, a cooling-performance assessment of the space. In at least one example, the at least one processor further is configured to display the cooling performance assessment with a view of the racks in a simulated IT room on a graphic-user interface showing at least one of a simulated airflow or temperature gradient through the simulated IT room.

According to at least one aspect of the disclosure, an IT-equipment-cooling design system is provided comprising at least one processor coupled to at least one memory, wherein the at least one processor is configured to receive physical-object data indicating physical objects in a simulated IT room, wherein the physical-object data comprises object-location data, object-size data, equipment-load data, and rack data, receive containment-intent rules, apply the containment-intent rules to the physical-object data to determine a containment intent of the simulated IT room, wherein the containment intent is at least one of hot-aisle containment or cold-aisle containment, determine an inlet-temperature metric for racks associated with the rack data, determine at least one of a cold-aisle-capture metric or a hot-aisle-capture metric for the racks, determine a composite-rack metric of the racks based on the inlet-temperature metric and the at least one of the cold-aisle-capture metric or the hot-aisle-capture metric, and display the composite-rack metric in association with a view of the racks in a view of the simulated IT room in a graphic-user interface showing at least one of a simulated airflow or temperature gradient through the simulated IT room.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

FIG. 1A illustrates a schematic diagram of a cold-aisle capture index displayed in a simulation according to an example;

FIG. 1B illustrates a schematic diagram of a hot-aisle capture index displayed in a simulation according to an example;

DETAILED DESCRIPTION

Figures 2A, 2B:
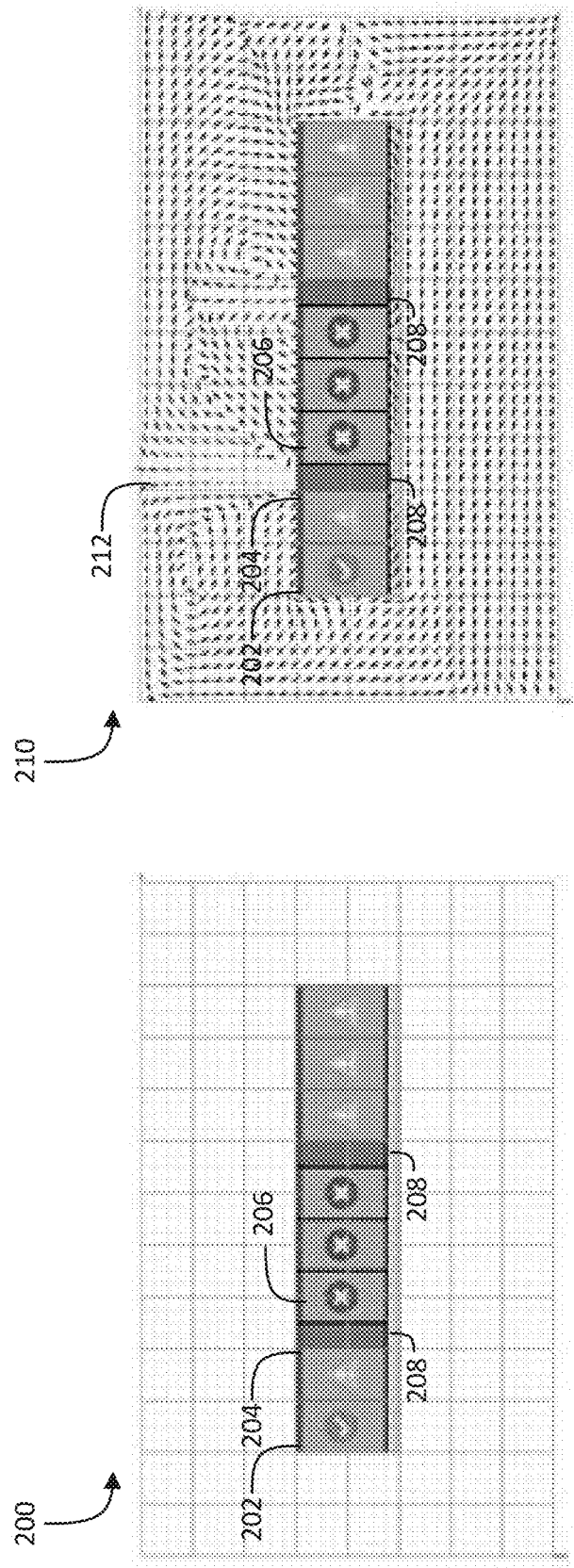
FIG. 2A illustrates a top-down schematic diagram of cooling-performance assessments of IT equipment in a simulation according to an example.
FIG. 2B illustrates a top-down schematic diagram of cooling-performance assessments of IT equipment and airflow-velocity vectors in a simulation according to an example.

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Information-technology (IT) rooms include spaces designed to house one or more IT devices (also referred to as "IT equipment," or "units of IT equipment"). IT devices include computers, storage, memory, networking devices, power-supply devices, and other physical devices or infrastructure to enable creating, processing, storing, securing, and/or exchanging electronic information and data. A data center is an example of an IT room. As discussed above, data centers include IT devices such as servers and power-supply devices to power the servers. For example, a data center may include a rack, which is also an IT device, configured to house and facilitate interconnection between servers, power-supply devices, and/or additional IT devices. Data centers may include cooling devices (or "cooling resources"), such as heating, ventilation, and air conditioning (HVAC) devices, to cool the IT room and/or IT devices. The cooling resources themselves may also be considered IT devices.

Certain industry groups, such as the American Society of Heating, Refrigerating, and Air-Conditioning Engineers (ASHRAE), may provide guidelines as to data-center cooling metrics and targets. For example, IT-equipment inlet temperature is a data-center-cooling-performance metric specified by certain data-center-industry guidelines. Data-center racks, or equipment housed thereby, may include air intakes to receive intake air to cool the housed equipment, and air exhaust to expel exhaust air. IT-equipment inlet temperature may refer to a temperature of air received at the air intake.

Temperature is a simple and familiar metric, and may be feasibly measured or predicted for an existing facility. Some IT products report and store key system temperatures and IT manufacturers may consider inlet-temperature history for issues related to warranty service and replacement. Temperature may be considered a "symptom" of underlying airflow patterns—outside of and inside of a rack, for example—which may or may not behave as intended for the selected cooling architecture. Undesirable airflow patterns may make the IT room less robust with respect to changing IT populations or workload and compromise energy efficiency.

IT-room designers may therefore consider airflow patterns in designing an IT room. Some IT rooms use standard cooling architectures which may have specific "design intent" regarding the airflow patterns associated with the supply of cool air to IT inlets and the capturing of warm air from IT exhausts. For example, with a traditional raised-floor architecture, cooling airflow is intended to be supplied directly from perforated tiles to IT-equipment inlets. As another example, row-based cooling is intended to supply cooling airflow directly to the IT equipment and capture warm IT exhaust airflow directly from IT equipment. In some examples, a design intent may therefore refer to an intended "containment" of intake air or exhaust air.

A containment type may be one of several known airflow-containment schemes, such as hot-aisle containment, cold-aisle containment, hot-and-cold-aisle containment, or no containment (or "uncontained"). Such containment refers to the spatial containment of cold air supplied by cooling resources into one or more "cold aisles," and/or the spatial containment of hot exhaust air output by units of IT equipment into one or more "hot aisles," and are employed in industries such as data-center design. A design intent for a particular containment type may be determined based on an arrangement of IT equipment, such as by determining whether cooling resources are positioned relative to IT-equipment intakes in a manner that produces a cold aisle.

When cold- or hot-aisle containment is employed, the design intent (to supply cold air directly to IT inlets or capture warm air directly from IT exhausts, for example) may be relatively clear. In some architectures, the design intent is less clear or is simply to mix cool air into the entire whitespace volume. For example, when airflow is supplied around the perimeter of the room in a "flooded" rather than "targeted" manner. As discussed above, if it is not apparent that there is a design intent for any particular containment, a containment type may be determined to be "uncontained."

Computational fluid dynamics (CFD) software may be employed when designing a new IT room or assessing an existing IT room to visualize airflow patterns. Such CFD software may be used to evaluate whether a design intent is being effectively realized, for example, by providing parameter predictions (for example, predicted temperatures) and simulated visualizations (for example, a simulated visualization of airflow patterns). While CFD simulations may enable a user to predict IT-inlet temperatures, such simulations may also predict airflow patterns, temperatures, and pressures at all points throughout the facility as well as other derived quantities and metrics. Consequently, a CFD simulation may provide rich and detailed information more quickly and/or easily, in some examples, than can be practically measured in an actual facility.

However, time and expert knowledge are required to interpret such information. While CFD software may provide information such as airflow patterns that may aid a user in evaluating an IT-room design, the CFD software does not provide an assessment of the IT-room design. Rather, a user is left to interpret and assess the information. Moreover, because there are multiple types of capture indices and one, multiple, or none may apply depending on a specific cooling architecture, capture indices may not be considered by CFD software that cannot determine which, if any, capture indices are applicable. Existing solutions may therefore determine cooling efficacy based only on temperature values (for example, IT-inlet temperatures), rather than capture indices such as a hot-aisle capture index (HACI) and a cold-aisle capture index (CACI), which may yield inaccurate results by failing to include all available information in making an efficacy determination. CFD software for IT-room design thus not only requires extensive experience and training to interpret because no assessment is provided, but also may fail to property account for capture indices by either omitting the capture indices or selecting improper capture indices.

In light of the foregoing, certain examples of the disclosure provide a cooling-performance assessment for each IT device in an IT room, such as each rack in a data center. Each IT device may receive a cooling-performance-assessment classification of "good," "marginal," or "bad" based on the cooling-performance assessment. A graphical user interface (GUI) may display a representation of the IT devices in the IT room overlaid with the classifications, and/or a graphical representation of each of the classifications (for example, a green checkmark representing a "good" classification, a yellow yield sign representing a "marginal" classification, and/or a red "X" mark representing a "bad" classification) for each of the IT devices.

The cooling-performance assessment may be a function of inlet temperature, capture indices, and the specific data-center cooling architecture. At least by incorporating the captures indices and specific data-center cooling architecture in generating the cooling-performance assessment, more accurate information is provided in addition to an overall cooling-performance assessment rather than simply raw data or calculations. Moreover, information is displayed in an easily comprehensible format by displaying a GUI having representations of the IT devices in the IT room overlaid with representations of the cooling-performance-assessment classifications for each IT device. It is to be appreciated that, although certain examples are provided with respect to data centers, examples of the disclosure are more broadly applicable to other architectures and IT rooms involving heating and/or cooling technologies.

Current IT-room-design systems may therefore fail to provide an accurate or easily comprehensible assessment of IT-room cooling performance. Such systems may operate inefficiently, because extensive training and expertise is required, and less than all available information may be properly utilized in evaluating an IT room. Moreover, such systems may simply provide raw data or calculations rather than an overall cooling-performance assessment, which requires that a human user perform a subjective review of the data and calculations. The raw data or calculations of existing systems may not be displayed via an easily comprehensible GUI and therefore may require additional time and expertise to interpret.

This is a technical problem. An exemplary embodiment of an IT-room-design system includes an information-technology-design system comprising at least one processor coupled to at least one memory. The at least one processor is configured to receive information-technology-device information indicative of a plurality of information-technology devices in a space, the information-technology-device information including information-technology-device-location information, temperature information, and capture-index information, determine, based on the information-technology-device information, a containment type of the plurality of information-technology devices, select, based on the containment type, at least a portion of the capture-index information, determine, based on the information-technology-device-location information, the temperature information, and the at least the portion of the capture-index information, a respective cooling-performance assessment for each information-technology device of the plurality of information-technology devices, and display an indicator of the respective cooling-performance assessment for each information-technology device of the plurality of information-technology devices in the space. At least this foregoing combination of features comprises an IT-room-design system that serves as a technical solution to the foregoing technical problem. This technical solution is not routine and is unconventional. This technical solution is a practical application of the IT-room-design system that solves the foregoing technical problem and constitutes an improvement in the technical field of IT-room-design visualization at least by providing a more accurate cooling-performance assessment and a more easily comprehensible cooling-performance-assessment display.

Examples of the disclosure include determining a cooling-performance assessment for an IT device based at least in part on a temperature, a location of the IT device, and one or more capture indices for the IT device. As discussed above, capture indices may include a CACI and/or a HACI. Using a rack in a data center as an example, a CACI may be defined as the percentage of a rack's intake cooling airflow supplied directly by local cooling resources such as perforated floor tiles or local cooling units. A HACI may be defined as the percentage of a rack's exhaust airflow which is directly captured by local cooling resources such as perforated ceiling tiles or local cooling units.

FIG. 1A illustrates a schematic diagram of a CACI being used in a simulation display 100 according to an example. The simulation display 100 includes a first group of racks 102 having a first rack 104, and a second group of racks 106 having a second rack 108. The simulation display 100 also includes an airflow pattern 110 indicative of a simulated airflow. The simulation display 100 displays a first CACI of the first rack 104 ("84%") overlaid on the first rack 104, and a second CACI of the second rack 108 ("26%") overlaid on the second rack 108. The CACIs may be calculated by CFD software. For example, the CFD software may analyze an arrangement of IT devices, such as server racks, and calculate predicted CACIs based on the position of IT devices, cooling equipment, and so forth.

The first CACI indicates that 84% of intake air received by the first rack 104 is provided directly by a cooling resource. The second CACI indicates that 26% of the intake air received by the second rack 108 is provided directly by a cooling resource. As depicted by the airflow pattern 110, much of the intake air of the second rack 108 may be received from an exhaust of the first rack 104, thus at least partially explaining the relatively low value of the second CACI.

FIG. 1B illustrates a schematic diagram of a HACI being used in a simulation display 112 according to an example. The simulation display 112 includes a first group of racks 114 having a first rack 116, and a second group of racks 118 having a second rack 120. The simulation display 112 also includes an airflow pattern 122 indicative of a simulated airflow. The simulation display 112 displays a first HACI of the first rack 116 ("99%") overlaid on the first rack 116, and a second HACI of the second rack 120 ("66%") overlaid on the second rack 120. The HACIs may be calculated by CFD software. For example, the CFD software may analyze an arrangement of IT devices, such as server racks, and calculate predicted HACIs based on the position of IT devices, cooling equipment, and so forth.

The first HACI indicates that 99% of exhaust air output by the first rack 116 is provided directly to a cooling resource. The second HACI indicates that 66% of the exhaust air output by the second rack 120 is provided directly to a cooling resource. As depicted by the airflow pattern 122, much of the exhaust air output by the second rack 120 may be received at an intake of a third rack 124, thus at least partially explaining the relatively low value of the second HACI.

Accordingly, CACIs and HACIs may be determined based at least in part on a position, a number, and operating parameters of local cooling supplies and/or returns. The "design intent" of the cooling architecture may be incorporated into the capture-index calculation (for example, a calculation performed by CFD software) by rules that govern what is considered a "local" cooling supply or return. For example, when there are no obvious local cooling supplies or returns, neither the CACI nor HACI may be computed. In other examples, the CACIs and/or HACIs may be computed even when there are no obvious local cooling supplies or returns.

CFD software may determine whether or not to classify supplies and/or returns as local cooling supplies and/or returns. In one example for a standard raised-floor architecture, all perforated tiles located within a cold aisle adjacent to a rack may be considered local supplies. If the return airflow to the cooling units is via a dropped ceiling, all the perforated ceiling tiles over the corresponding adjacent hot aisle may be considered local returns in some examples. CFD software may incorporate rules to precisely define which equipment are part of specific cold- and hot-aisle groupings in some examples. Such rules may be adopted for other cooling architectures such as row-based cooling, for example. In various examples, local supplies and returns are those of the row-based cooling units which are considered members of the same cold- or hot-aisle grouping as a given rack. In some examples, combinations of cooling architectures are possible so that, for example, row-based-cooler supplies and perforated floor tiles may be considered "local supplies" associated with a given rack. The application of such rules may imply that a finite value returned for cold or hot aisle capture indices indicates the presence of local supplies or returns and, more generally in some examples, the design intent of the cooling architecture.

Capture indices may be indicative of airflow external to the rack and, in some examples, internal to the rack. Depending on the level of modeling detail included and the goals of the CFD simulation, airflow patterns internal to the rack may or may not be considered in determining capture indices. For example, a HACI calculation may track the IT-equipment exhaust through the rack (for example, passing through a perforated rear door or top leakage paths) into an IT room and, ultimately, into the return of local cooling equipment (or not, such as by flowing into an intake of other IT equipment). In some examples, internal and external captures indices may be determined as separate metrics. For example, an internal HACI may be determined based on IT exhaust to the rear or top of the rack and an external HACI may be determined based on IT exhaust from the rear or top of the rack through the IT room. Similar principles apply to determining one or more CACIs. In another example, an overall capture index may be determined that either incorporates both internal and external metrics or that ignores one of the internal or external metrics.

For purposes of explanation, in various examples discussed herein internal and external capture indices may not be explicitly distinguished, and an overall capture index may instead be determined. In other examples, however, either or both of an external or internal capture index may be determined. For example, some CFD simulations may not provide any airflow information inside of the rack and only the external capture index is possible. In other cases, the internal capture indices may be easier to compute (for example, because rack internals may be idealized in some examples, whereas the external data-center environment may be variable and assumptions about definitions of "local cooling" may be included). Further, internal capture indices may be sufficient in cases where performance is limited by internal-rack airflow patterns (for example, when containment results in pressure variations which may drive internal airflows and re-circulations).

In various examples, a cooling-performance assessment may be determined for each unit of IT equipment. For example, in the context of a data center, a cooling-performance assessment may be determined for each rack in the data center. The cooling-performance assessment may classify each rack as having "good" cooling, "marginal" cooling, or "bad" cooling. The classification may be determined based on IT-inlet temperatures (that is, input-air temperatures) and capture indices (for example, CACIs and/or HACIs). In various examples, the IT-inlet temperatures and capture indices for each unit of IT equipment may also be classified as "good," "marginal," or "bad," and the cooling-performance assessment may be determined based on these classifications. In other examples, the cooling-performance assessment may be determined based on the IT-inlet temperatures and/or the capture indices directly, rather than being based on classifications thereof. Although in some examples a cooling-performance assessment may be determined for each rack, in other examples a cooling-performance assessment may be determined for units of IT equipment at a lower level of granularity, such as for each rack server, or at a higher level of granularity, such as for each row of racks.

A simulation may be displayed (for example, via a GUI) to illustrate the respective cooling-performance assessments of each unit of IT equipment. For example, FIG. 2A illustrates a schematic diagram of a simulation display 200 depicting cooling-performance assessments for each rack in a data center according to an example. The simulation display 200 includes depictions of several racks including a first rack 202, a second rack 204, and a third rack 206, and includes depictions of cooling units, each indicated at 208. A cooling-performance assessment may be determined for each of the racks 202-206 based at least in part on cooling provided by the cooling units 208. As discussed in greater detail below, a cooling-performance may be determined for each of the racks 202-206 automatically and, in some examples, may automatically select and use one or more capture indices in determining the cooling-performance assessments. The simulation display 200 may include a representation of each cooling-performance-assessment classification.

For example, the first rack 202 is displayed with a green check overlaid on the first rack 202. A green check may be an representation of a "good" classification of the first rack 202 in a cooling-performance assessment, indicating that the first rack 202 may be adequately cooled. The second rack 204 is displayed with a yellow triangle overlaid on the second rack 204. A yellow triangle may be an representation of a "marginal" classification of the second rack 204 in a cooling-performance assessment, indicating that minor opportunities exist for improving cooling of the second rack 204. The third rack 206 is displayed with a red "X" overlaid on the third rack 206. A red "X" may be a representation of a "bad" classification of the third rack 206 in a cooling-performance assessment, indicating that major opportunities exist for improving cooling of the third rack 206. It is to be appreciated a number and meaning of cooling-performance-assessment classifications, and the depictions thereof, may vary within the scope of the disclosure.

In various examples, a simulation display of cooling-performance assessments may be displayed along with any other CFD-predicted quantities including temperature values, temperature maps, pressure, airflow animations, and so forth. Such CFD-predicted quantities may be displayed numerically, graphically, a combination of both, and so forth.

Furthermore, although certain representations of cooling-performance classifications (for example, a "green check-mark" representation of a "good" classification, a "yellow yield sign" representation of a "marginal" classification, and/or a "red 'X' mark" representation of a "bad" classification) are illustrated for purposes of example, it is to be appreciated that alternate representations and/or corresponding classifications are within the scope of the disclosure.

For example, FIG. 2B illustrates a schematic diagram of a simulation display 210 depicting cooling-performance assessments for each rack in a data center in combination with airflow velocity vectors according to an example. The simulation display 210 is substantially similar to the simulation display 200, and like aspects are labeled accordingly. The simulation display 210 further includes airflow velocity vectors 212 indicating a speed and direction of simulated airflow in an environment around the racks 202-206 and cooling units 208. The airflow velocity vectors 212 may provide additional context to a viewer viewing the simulation display 210. For example, a viewer may be able to visualize and diagnose a cause of each cooling-performance assessment using the airflow velocity vectors 212 and, if desired, make design modifications as needed to improve the cooling-performance assessments.

Figure 2C:
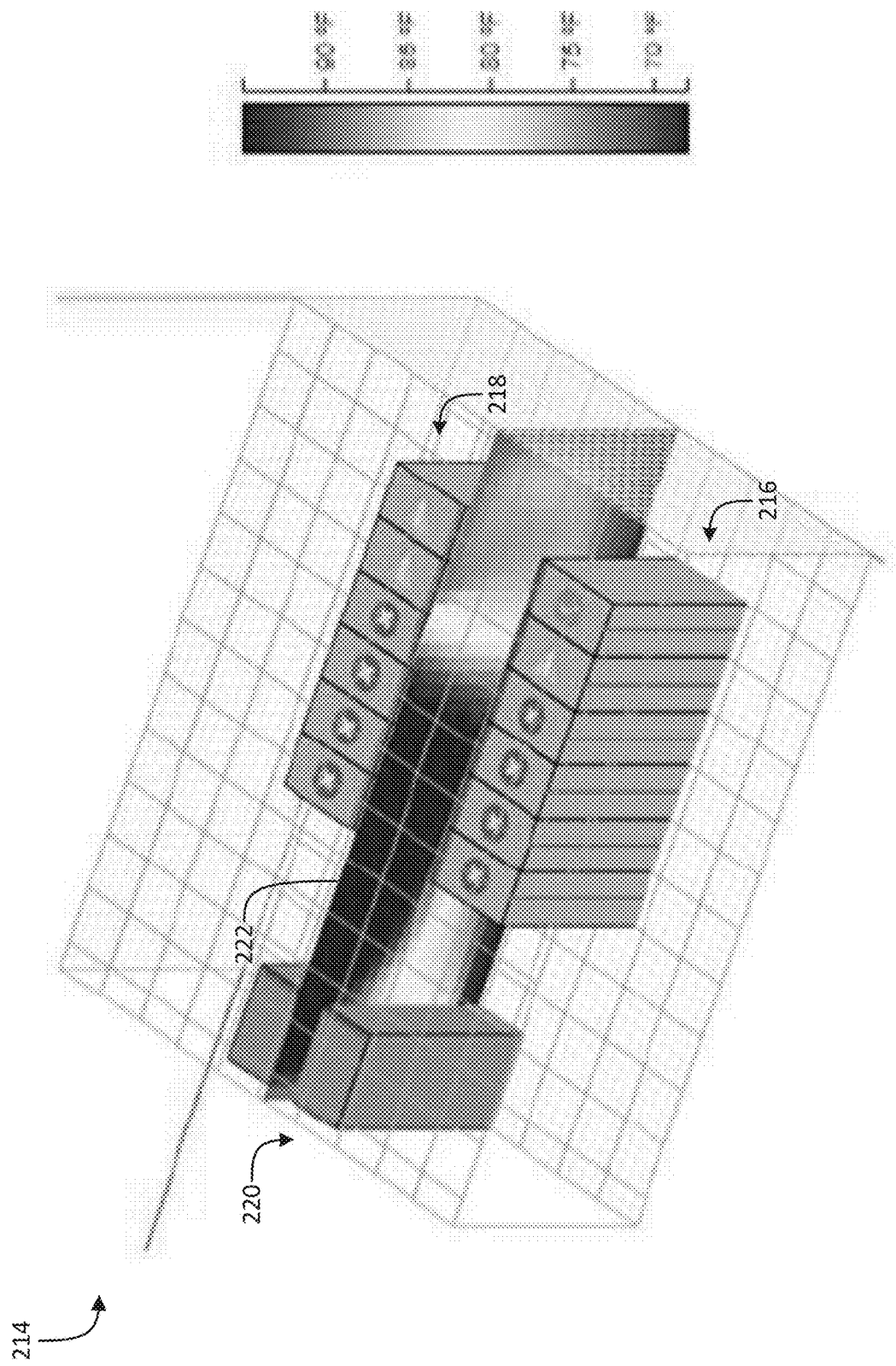
FIG. 2C illustrates a perspective schematic diagram of cooling-performance assessments of IT equipment and a temperature map in a simulation according to an example.

In another example, FIG. 2C illustrates a schematic diagram of a simulation display 214 depicting cooling-performance assessments for each rack in a data center in combination with a temperature map according to an example. The simulation display 214 is similar to the simulation displays 200, 210, albeit with a different IT-equipment configuration. For example, the simulation display 214 includes an indication of a first group of racks 216, an indication of a second group of racks 218, and an indication of cooling resources 220. Each rack of the groups of racks 216, 218 is displayed with a cooling-performance assessment overlaid thereon. Furthermore, the simulation display 214 includes a temperature map 222. The temperature map 222 provides a color-coded representation of a local temperature and additional context to a viewer viewing the simulation display 214. For example, a viewer may be able to visualize and diagnose a cause of each cooling-performance assessment using the temperature map 222 and, if desired, make design modifications as needed to improve the cooling-performance assessments.

Figure 3:
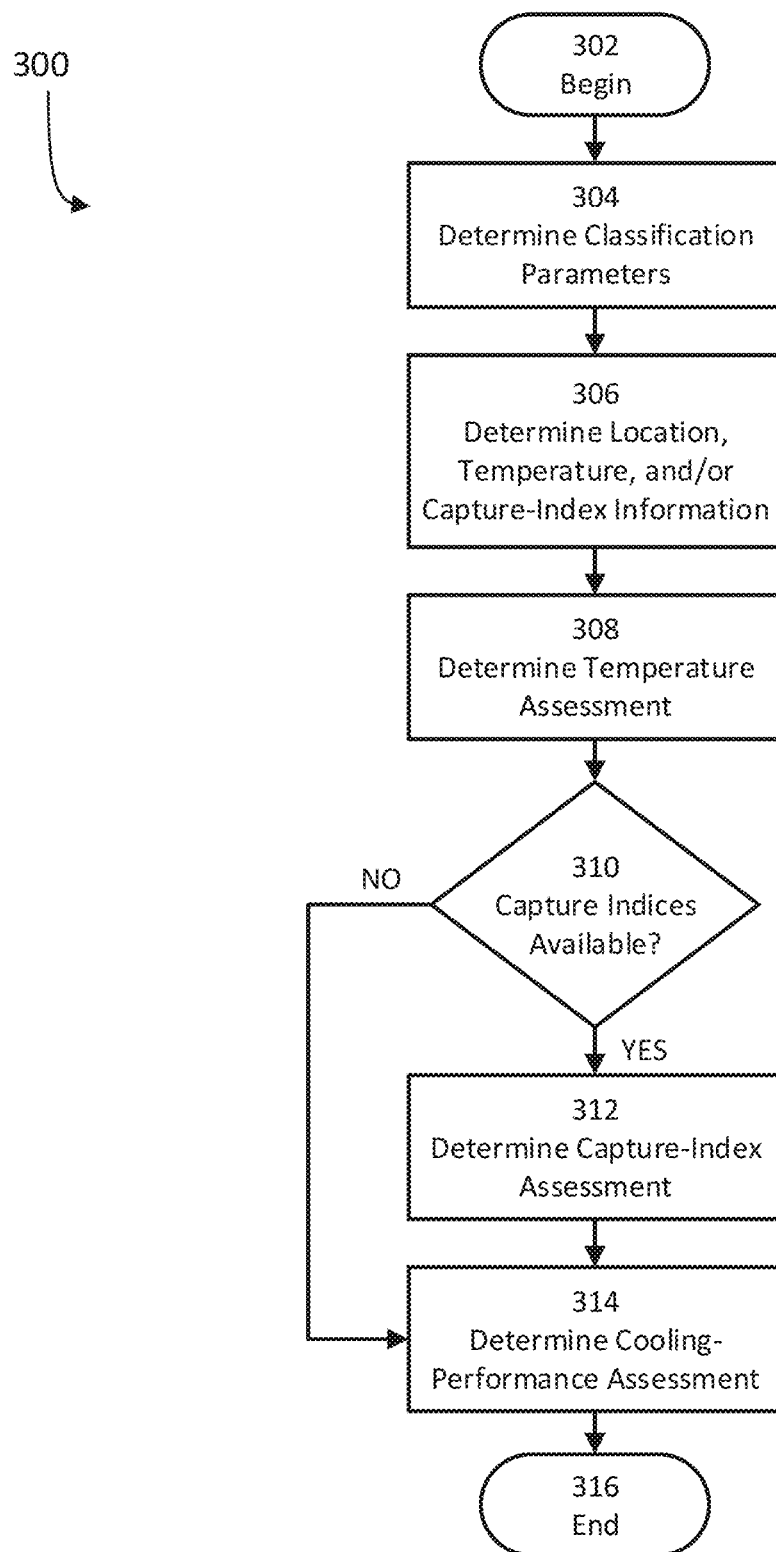
FIG. 3 illustrates a process of determining a cooling-performance assessment for one or more information-technology devices.

FIG. 3 illustrates a process 300 of determining a cooling-performance assessment for one or more units of IT equipment according to an example. The process 300 may be executed in connection with, or as part of, CFD software. A computing device, which may be local to or remote from an IT room containing the analyzed IT equipment, may execute the process 300 to aid a user in designing or analyzing the IT room. The process 300 may be executed for each respective unit of IT equipment. In one example, each unit of IT equipment is a data-center rack.

At act 302, the process 300 begins.

At act 304, classification parameters are determined. A cooling-performance assessment may be determined based on a temperature classification (or "temperature assessment") and/or a capture-index classification (or "capture-index assessment"). A temperature classification may be determined by determining an IT-inlet-temperature value and classifying the IT-inlet temperature into one of several categories, such as "good," "marginal," or "bad." Similarly, a capture-index classification may be determined by determining one or more capture indices and classifying the one or more capture indices into one of several categories, such as "good," "marginal," or "bad." Classification parameters are used to classify received IT-inlet-temperature values and/or capture-index values within a respective classification, such as "good," "marginal," or "bad." It is to be appreciated that although three example classifications are provided, in other examples, a different type and/or number of classifications may be provided, and that a type and/or number of classifications for temperature may different from those for capture indices.

Figure 4:
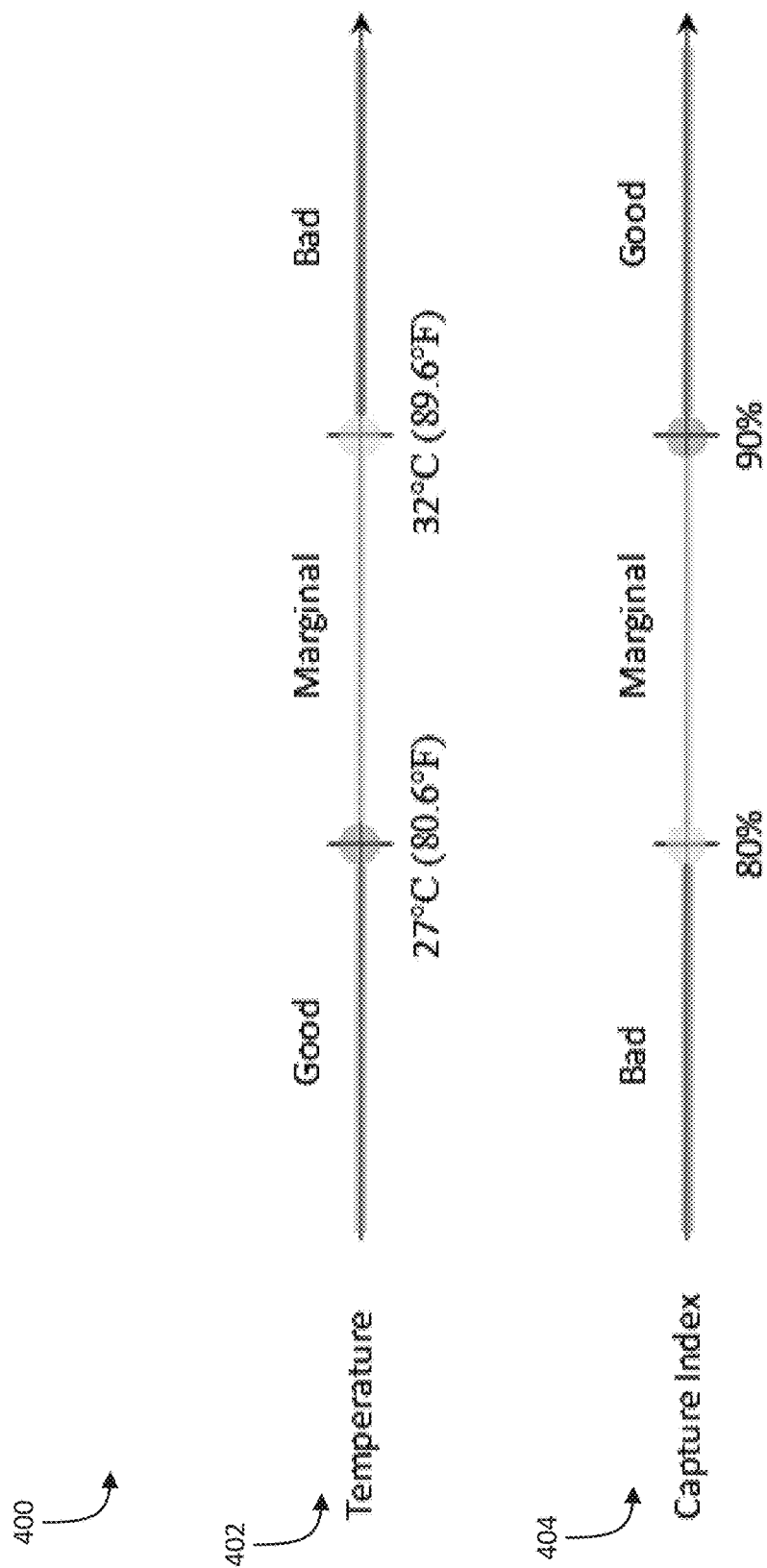
FIG. 4 illustrates a graph of classifications of temperatures and capture indices according to an example.

FIG. 4 illustrates a graph 400 of temperature- and capture-index-classification parameters according to an example. The temperature-classification parameters are illustrated by a temperature-classification scale 402 and the capture-index-classification parameters are illustrated by a capture-index-classification scale 404. As illustrated by the temperature-classification scale 402, an IT-inlet-temperature value of greater than 32° C. may be classified as "bad," an IT-inlet-temperature value of 32° C. or less but greater than 27° C. may be classified as "marginal," and an IT-inlet-temperature value of 27° C. or less may be classified as "bad." Similarly, as illustrated by the capture-index-classification scale 304, a capture index of 90% or greater may be classified as "good," a capture index of greater than 80% but less than 90% may be classified as "marginal," and a capture index of 80% or less may be classified as "bad." In various examples, the classification parameters used to classify temperature and/or capture indices may be based on industry guidelines, such as ASHRAE guidelines. It is to be appreciated, however, that other ranges and values are within the scope of the disclosure, and that the depicted classification parameters are provided for purposes of example only.

At act 306, temperature information, capture-index information, and/or information-technology-device-location information (or "location information") are determined. The temperature information, capture-index information, and location information may collectively be referred to as "information-technology-device information." The information-technology-device information may be received from storage or an external device, and/or calculated by the CFD software, and may be measured, calculated, and/or simulated. For example, CFD software may access certain device parameters (such as server power, for example, which can be used to determine a predicted heat output) which can be used to predict relevant parameters of an IT room and/or IT equipment. The temperature information includes temperature values, such as IT-inlet-temperature values indicative of a temperature of air drawn into an airflow intake of each unit of IT equipment. The capture-index information includes a HACI and/or CACI for each unit of IT equipment. The location information includes information indicative of a position, orientation, and/or size of each IT device in an IT room, such as each rack and/or cooling resource in a data center. In some examples, the location information further includes, or may be used to determine, containment information. Containment information may include a containment type of each unit of IT equipment.

In one example, a containment type is one of several known airflow-containment schemes, such as hot-aisle containment, cold-aisle containment, hot-and-cold-aisle containment, or no containment (or "uncontained"). As discussed above, such "containment" may refer to the spatial containment of cold air supplied by cooling resources into one or more "cold aisles," and/or the spatial containment of hot exhaust air output by units of IT equipment into one or more "hot aisles," and may be employed in industries such as data-center design. In one example, the containment information includes the containment type. In another example, the location information may be used to determine the containment type. For example, the location information may include a location and properties of (for example, power, cooling capacity, and so forth) one or more racks and one or more cooling resources, such that a containment type may be determined therefrom. Accordingly, act 306 includes receiving, for each unit of IT equipment, respective temperature information, capture-index information, and location information.

At act 308, a temperature assessment is determined. As discussed above, the classification parameters determined at act 304 may be used to classify, for each unit of IT equipment, the temperature information received at act 306 into one of several categories. For example, if the temperature information received at act 306 indicates, for a certain unit of IT equipment, a temperature value of 33° C., then in accordance with the example classification parameters of FIG. 4 a temperature assessment for the unit of IT equipment is "bad."

At act 310, a determination is made as to whether capture indices are available. Capture indices may include one or both a HACI and a CACI. Capture-index information, which may be received at act 306 in some examples, may include or be used to determine a HACI and/or a CACI. As discussed above, because capture indices may be determined based on an IT-room design intent, capture-index information may not be received, or may not be sufficient to determine a HACI and/or a CACI, at act 306 where a design intent is unclear, for example. If capture indices are available (310 YES), the process 300 continues to act 312. Otherwise, if capture indices are not available (310 NO), then the process 300 continues to act 314.

At act 312, a capture-index assessment is determined responsive to determining that one or more capture indices are available. As discussed above, the classification parameters determined at act 304 may be used to classify, for each unit of IT equipment, the capture-index information received at act 306 into one of several categories. For example, if the capture-index information received at act 306 indicates, for a certain unit of IT equipment, a capture index of 95%, then in accordance with the example classification parameters of FIG. 4 a capture-index assessment for the unit of IT equipment is "good."

Figure 5:
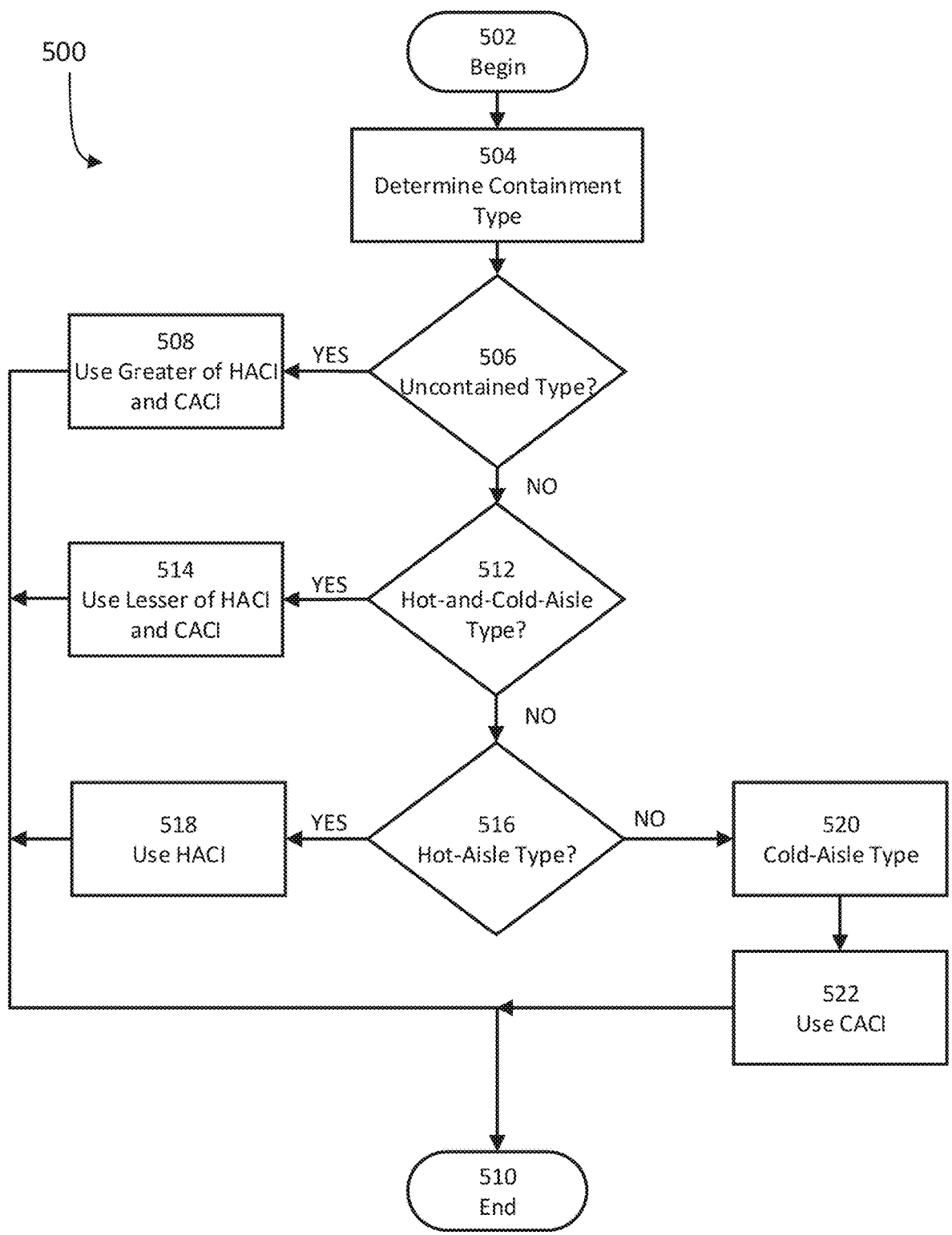
FIG. 5 illustrates a process of selecting a capture index for use in determining a cooling-performance assessment according to an example.

Act 312 may include selecting only a portion of the capture-index information to determine a capture-index assessment. For example, although both a HACI and a CACI may be available from the capture-index information, act 312 may include selecting only one of the HACI or the CACI to determine the capture-index assessment. One of the HACI or the CACI may be selected for determining the capture-index assessment based on the containment type indicated by the location information received at act 306. Table 1 indicates which capture index is used to determine a cooling-performance assessment based on a containment type according to one example. FIG. 5, discussed in greater detail below, illustrates a manner of selecting a capture index (that is, selecting a portion of the capture-index information) for use in determining a cooling-performance assessment where multiple capture indices (for example, a HACI and a CACI) are available in greater detail. If only one capture index is available, that capture index may be used at act 312 rather than executing the process of FIG. 5, in some examples.

TABLE 1

Capture Index Assessment Metric

| Containment Type | Capture Index to Use |
| --- | --- |
| Uncontained Type | Maximum of CACI and HACI |
| Cold-Aisle Type | CACI |
| Hot-Aisle Type | HACI |
| Cold-and-Hot-Aisle Type | Minimum of CACI and HACI |

At act 314, a cooling-performance assessment is determined based on a temperature assessment determined at act 308 and, in some examples, a capture-index assessment determined at act 312. In examples in which a cooling-performance assessment is determined based only on a temperature assessment (for example, where the process 300 continues from act 310 directly to act 314 [310 NO]), the cooling-performance assessment may be set equal to the temperature assessment. For example, for a unit of IT equipment having a "bad" temperature assessment, the cooling-performance assessment may be determined at act 314 to be "bad."

Conversely, in examples in which a cooling-performance assessment is determined based on a capture-index assessment in addition to a temperature assessment, the same or different weights may be given to the temperature assessment and the capture-index assessment in determining the cooling-performance assessment. For example, a temperature assessment may be given more weight than a capture-index assessment in one example. It is to be appreciated that a "bad" capture index may not indicate that IT equipment will be immediately compromised. For example, if an IT-inlet temperature is classified as "good" despite capture indices being classified as "bad," IT equipment may operate without being compromised but may have opportunities for improvement. In other examples, a capture-index assessment may be given the same weight as, or more weight than, a temperature assessment.

Table 2 illustrates an example of a cooling-performance assessment for units of IT equipment for which a temperature assessment and a capture-index assessment are available. Act 314 may therefore include determining, based on the temperature assessment and capture-index assessment, a cooling-performance assessment in the manner illustrated by Table 2. As discussed above, a temperature assessment may be weighted more heavily than a capture-index assessment in determining a cooling-performance assessment in some examples. For example, a "bad" temperature assessment and a "good" capture-index assessment may yield a "bad" cooling-performance assessment in some examples. In another example, however, a "good" temperature assessment and a "bad" capture-index assessment may yield a higher rating of a "marginal" cooling-performance assessment. That is, while Table 2 provides one scheme of determining a cooling-performance assessment, other schemes are within the scope of the disclosure.

In some examples, a capture-index assessment may only lower the cooling-performance assessment to "marginal" in cases in which the temperature is "good." In some examples in which temperatures are "marginal" or "bad," the cooling-performance assessment may be equal to the temperature assessment. Alternatively, the temperature and capture index assessments could be given different weightings depending on the application. That is, while Table 2 provides one example of cooling-performance assessments, in other examples, a cooling-performance assessment may differ from the examples provided in Table 2.

TABLE 2

Cooling Performance Assessment, Racks with Capture Index Values

| Temperature Assessment | Capture-Index Assessment | Cooling-Performance Assessment |
| --- | --- | --- |
| Good | Good | Good |
| Marginal | Good | Marginal |
| Bad | Good | Bad |
| Good | Marginal | Marginal |
| Marginal | Marginal | Marginal |
| Bad | Marginal | Bad |
| Good | Bad | Marginal |
| Marginal | Bad | Marginal |
| Bad | Bad | Bad |

At act 316, the process 300 ends.

As discussed above and as illustrated in FIGS. 2A-2C, indicators of each of the one or more cooling-performance assessments may be displayed to a user. For example, a simulation may display a 3D model of each unit of IT equipment with a respective indicator of a cooling-performance assessment overlaid on each 3D model. The simulation may further display temperature maps, airflow patterns, and/or other assets with each respective indicator of the cooling performance assessment. As discussed above, the cooling-performance assessment may be a representation of a respective cooling-performance classification, for example, being classified as "good," "marginal," or "bad."

It is to be appreciated that modifications to the process 300 are within the scope of the disclosure, such as by modifying an order of acts of the process 300. For example, a capture-index assessment may be determined prior to, or simultaneously with, determining a temperature assessment in some examples. Furthermore, as discussed above, a different number and/or type of temperature assessments, capture-index assessments, and/or cooling-performance assessments (that is, other than or in addition to "good," "marginal," and "bad") may be implemented in some examples. Accordingly, a table other than Table 2 may be implemented to determine a cooling-performance assessment based on a temperature assessment and/or capture-index assessment in some examples.

As discussed above, act 312 includes determining a capture-index assessment based on a selected one of one or more capture indices. FIG. 5 illustrates a process 500 of selecting a capture index with which to determine a capture-index assessment according to an example. The process 500 may be an example of act 312 and may be executed by a computing device executing the process 300.

At act 502, the process 500 begins.

At act 504, a containment type of an IT space being analyzed is determined. As discussed above with respect to Table 1, one of a HACI or a CACI may be selected based on a containment type. In one example, the containment type may be one of an uncontained type, a cold-aisle type, a hot-aisle type, or a hot-and-cold-aisle type. The containment type may be determined based on the information-technology-device information, which includes location information, received at act 306. As discussed above, the location information may include containment information indicating a containment type. Alternatively, the location information may include information indicative of a position, orientation, and/or physical size of IT devices in a space, such as information indicative of a position, orientation, and physical size of each rack and cooling resource in a data center, which may be used by CFD software to determine a containment type.

At act 506, a determination is made as to whether the containment type is an uncontained type. An uncontained type is one in which there is not a design intent to establish either cold-aisle or hot-aisle containment. In various uncontained architectures, such as an uncontained row-based-cooling architecture, both a CACI and a HACI may be determined for units of IT equipment, because the units of IT equipment may have a cold aisle on one side and a hot aisle on an opposite side. If the containment type is an uncontained type (506 YES), the process 500 continues to act 508.

At act 508, a greater of the CACI and the HACI is used for determining a cooling-performance assessment. For example, if a CACI for a unit of IT equipment is 90%, and a HACI for the unit of IT equipment is 66%, then the CACI is used. The greater of the CACI and the HACI may be selected because the greater capture index may be enough to ensure good cooling airflow delivery to IT inlets or to effectively capture warm IT exhaust before the exhaust has the opportunity to affect IT inlets. In some examples, it may be unnecessarily conservative to both ensure good airflow delivery and to ensure effective exhaust recapture, such that only one capture index need be considered. The process 500 then continues to act 510, and the process 500 ends. Where the process 500 is implemented as an example of act 312, the process 300 may then continue to act 314 to determine a cooling-performance assessment based on the greater of the HACI and the CACI.

Otherwise, if the containment type is not uncontained (506 NO), the process 500 continues to act 512. For example, for containment types other than the uncontained type, a design intent may be more apparent from a configuration of IT equipment. For example, the design intent may place a greater emphasis on recapturing IT exhaust, ensuring good airflow delivery, or a combination of both. It may be advantageous to select a capture index that aligns with the design intent for determining the cooling-performance assessment.

At act 512, a determination is made as to whether a containment type is a hot-and-cold-aisle containment type, that is, in which both hot- and cold-aisle containment are implemented. Consequently, both a CACI and a HACI may be relevant and determined, though only one is selected for determining a cooling-performance assessment. If the containment type is the hot-and-cold-aisle containment type (512 YES), then the process 500 continues to act 514.

At act 514, a lesser of a CACI and a HACI is selected. For example, if a CACI for a unit of IT equipment is 90%, and a HACI for the unit of IT equipment is 66%, then the HACI is selected. In various examples, the design intent of a hot-and-cold-aisle containment architecture may be that both the cold-aisle and hot-aisle containment should "work properly" such that the most limiting capture index (that is, the lower capture index) is used. The process 500 continues to, and ends at, act 510.

Otherwise, if the containment type is not the hot-and-cold-aisle containment type (512 NO), then the process 500 continues to act 516. At act 516, a determination is made as to whether the containment type is a hot-aisle containment type. If the containment type is a hot-aisle containment type (516 YES), then the process 500 continues to act 518.

At act 518, a HACI is used to determine a cooling-performance assessment. Hot-aisle containment may emphasize containing IT-equipment exhaust in a hot-aisle containment. Accordingly, because the design intent may focus on hot-air recapture, which the HACI is indicative of, the HACI may be most useful capture index in determining a cooling-performance assessment.

Otherwise, if the containment type is not the hot-aisle containment type (516 NO), then the process 500 continues to act 520. At act 520, a determination is made that the containment type is a cold-aisle containment type. That is, because a determination has already been made that the containment type is not an uncontained type, hot-aisle type, or hot-and-cold-aisle type, only the cold-aisle type remains in this example. It is to be appreciated that this determination may be limited to examples in which a containment type is known to be one of the four listed containment types, and a determination has already been made that the containment type is not any of the other three containment types.

At act 522, a CACI is used to determine a cooling-performance assessment. Cold-aisle containment may emphasize containing IT-equipment intake in cold-aisle containment. Accordingly, because the design intent may focus on cold-air supply, which the CACI is indicative of, the CACI may be the most useful capture index in determining a cooling-performance assessment. The process 500 continues to, and ends at, act 510.

Accordingly, the process 500 provides a manner of determining whether to use a CACI or HACI in determining a cooling-performance assessment. It is to be appreciated that modifications to the process 500 are within the scope of the disclosure. For example, an order of the acts 500-522 may be modified in alternate examples, such as by rearranging an order of acts 506, 512, and/or 516. Furthermore, it is to be appreciated that additional and/or different containment types may be considered in alternate examples, and that different rules may be implemented to determine an applicable capture index based on the containment type.

Accordingly, a cooling-performance assessment may be determined for each of several units of IT equipment using a selected capture index. A depiction of the IT equipment may be displayed with each cooling-performance assessment determined at act 314 as illustrated, for example, in FIGS. 2A-2B. The cooling-performance assessment may be displayed together with the IT equipment and additional visualizations, such as a simulated airflow, a temperature-gradient map, and so forth.

Table 3 depicts several examples of generating cooling-performance assessments for IT equipment. Table 3 depicts determinations in accordance with the examples provided above and are intended to be illustrative rather than limiting.

TABLE 3

Cooling Performance Assessment Example Calculations

|  | Example 1 | Example 2 | Example 3 |
| --- | --- | --- | --- |
| Containment Type | None | Cold | Cold and Hot |
| Inlet Temperature (° C.) | 26.7 | 33 | 25 |
| CACI (%) | N/A | 72 | 92 |
| HACI (%) | N/A | 95 | 100 |
| Temperature Assessment | Good | Bad | Good |
| Capture Index Value | N/A | CACI = 72 | Min(CACI, HACI) = 92 |
| Capture Index Assessment | N/A | Bad | Marginal |
| Cooling Performance Assessment | Good | Bad | Marginal |

In Example 1, temperature information is provided indicating that an IT-inlet-temperature value is 26.7° C. Continuing with the example of FIG. 4, a temperature assessment for the IT equipment is "good." However, no capture indices (that is, HACI or CACI) are provided. For example, the cooling architecture may not include any local cooling such that capture indices are not applicable. Consequently, no capture-index assessment is provided, and a cooling-performance assessment is set equal to the "good" temperature assessment.

In Example 2, temperature information is provided indicating that an IT-inlet-temperature value is 29.4° C. Continuing with the example of FIG. 4, a temperature assessment for the IT equipment is "bad." Additionally, a HACI of 95% and a CACI of 72% are provided. A containment type is determined to be a cold-aisle containment type, and the CACI is therefore used to determine a capture-index assessment. Continuing with the example of FIG. 4, a capture-index assessment for a capture index of 72% is "bad." Pursuant to Table 2, above, a "bad" temperature assessment and a "bad" capture-index assessment yields a determination of a "bad" cooling-performance assessment. The cooling-performance assessment for the unit of IT equipment is therefore determined to be "bad."

In Example 3, temperature information is provided indicating that an IT-inlet-temperature value is 25° C. Continuing with the example of FIG. 4, a temperature assessment for the IT equipment is "good." Additionally, a HACI of 100% and a CACI of 92% are provided. A containment type is determined to be a hot-and-cold-aisle containment type, so a lesser of the HACI and the CACI is used. The CACI of 92% is less than the HACI of 100%, and the CACI is therefore used to determine a capture-index assessment. Continuing with the example of FIG. 4, a capture-index assessment for a capture index of 92% is "good." Pursuant to Table 2, above, a "good" temperature assessment and a "good" capture-index assessment yields a determination of a "good" cooling-performance assessment. The cooling-performance assessment for the unit of IT equipment is therefore determined to be "good."

In light of the foregoing, a cooling-performance assessment for use with IT equipment in an IT room is provided. The cooling-performance assessment may be determined in connection with a CFD simulation. In various examples, the IT equipment may include server racks, and the IT room may be a data center. Cooling-performance assessments may be determined and used in visualizations together with representations of IT equipment and other information, such as airflow patterns and temperature gradients, which provides a simple and fast assessment of IT-room cooling performance. However, it is to be appreciated that the cooling-performance assessment principles discussed above may be implemented in other environments, including CFD simulations in environments other than data centers.

Various controllers, such as a controller within a computing device (for example, a server) configured to execute the CFD software discussed above, may execute various operations discussed above. Using data stored in associated memory and/or storage, the controller also executes one or more instructions stored on one or more non-transitory computer-readable media, which the controller may include and/or be coupled to, that may result in manipulated data. In some examples, the controller may include one or more processors or other types of controllers. In one example, the controller is or includes at least one processor. In another example, the controller performs at least a portion of the operations discussed above using an application-specific integrated circuit tailored to perform particular operations in addition to, or in lieu of, a general-purpose processor. As illustrated by these examples, examples in accordance with the present disclosure may perform the operations described herein using many specific combinations of hardware and software and the disclosure is not limited to any particular combination of hardware and software components. Examples of the disclosure may include a computer-program product configured to execute methods, processes, and/or operations discussed above. The computer-program product may be, or include, one or more controllers and/or processors configured to execute instructions to perform methods, processes, and/or operations discussed above.

What is claimed is:

1. An information-technology-design system comprising:
at least one processor coupled to at least one memory, wherein the at least one processor is configured to
receive information-technology-device information indicative of a plurality of information-technology devices in a space, the information-technology-device information including information-technology-device-location information, temperature information, and capture-index information;
determine, based on the information-technology-device information, a containment type of the plurality of information-technology devices;
select, based on the containment type, at least a portion of the capture-index information;
determine, based on the information-technology-device-location information, the temperature information, and the at least the portion of the capture-index information, a respective cooling-performance assessment for each information-technology device of the plurality of information-technology devices; and
display an indicator of the respective cooling-performance assessment for each information-technology device of the plurality of information-technology devices in the space.

2. The system of claim 1, wherein the temperature information is indicative of an inlet temperature of air drawn by the plurality of information-technology devices.

3. The system of claim 1, wherein the capture-index information includes at least one of a cold-aisle capture index (CACI) or a hot-aisle capture index (HACI).

4. The system of claim 3, wherein the CACI is indicative of a percentage of cooling airflow provided to a respective information-technology device by a cooling resource.

5. The system of claim 3, wherein the HACI is indicative of a percentage of output airflow provided by a respective information-technology device to a cooling resource.

6. The system of claim 1, wherein the containment type is one of an uncontained type, a hot-and-cold-aisle containment type, a hot-aisle containment type, or a cold-aisle containment type.

7. The system of claim 6, wherein the capture-index information includes at least one of a cold-aisle capture index (CACI) or a hot-aisle capture index (HACI), and wherein selecting the at least the portion of the capture-index information based on the containment type includes selecting at least one of the CACI or the HACI based on the containment type being the uncontained type, the hot-and-cold-aisle containment type, the hot-aisle containment type, or the cold-aisle containment type.

8. The system of claim 7, wherein the at least one processor is configured to determine the cooling-performance assessment based on a greater of the CACI and the HACI responsive to determining that the containment type is the uncontained type.

9. The system of claim 7, wherein the at least one processor is configured to determine the cooling-performance assessment based on a lesser of the CACI and the HACI responsive to determining that the containment type is the hot-and-cold-aisle containment type.

10. The system of claim 7, wherein the at least one processor is configured to determine the cooling-performance assessment based on the HACI responsive to determining that the containment type is the hot-aisle containment type.

11. The system of claim 7, wherein the at least one processor is configured to determine the cooling-performance assessment based on the CACI responsive to determining that the containment type is the cold-aisle containment type.

12. The system of claim 1, wherein the at least one processor further is configured to display the respective indicator of the cooling-performance assessment for each respective information-technology device of the plurality of information-technology devices with a view of at least one of a simulated airflow or a temperature gradient in the space.

13. The system of claim 1, wherein each respective indicator of the cooling-performance assessment includes a respective cooling-performance classification of each information-technology device of the plurality of information-technology devices, and wherein the at least one processor is further configured to provide a view of the plurality of information-technology devices in the space and, for each information-technology device, a representation of a respective cooling-performance classification.

14. The system of claim 13, wherein the at least one processor further is configured to output the cooling-performance assessment with a view of at least one of a simulated airflow or a temperature gradient in the space with the representation of the respective cooling-performance classification for each information-technology device.

15. A non-transitory computer-readable medium storing thereon sequences of computer-executable instructions for assessing a space containing a plurality of information-technology devices, the sequences of computer-executable instructions including instructions that instruct at least one processor to:
receive information-technology-device information indicative of the plurality of information-technology devices in the space, the information-technology-device information including information-technology-device-location information, temperature information, and capture-index information;

determine, based on the information-technology-device information, a containment type of the plurality of information-technology devices;

select, based on the containment type, at least a portion of the capture-index information;

determine, based on the information-technology-device-location information, the temperature information, and the at least the portion of the capture-index information, a respective cooling-performance assessment for each information-technology device of the plurality of information-technology devices in the space; and display an indicator of the respective cooling-performance assessment for each information-technology device of the plurality of information-technology devices in the space.

16. The non-transitory computer-readable medium of claim 15, wherein the capture-index information includes at least one of a cold-aisle capture index (CACI) or a hot-aisle capture index (HACI), and wherein selecting the at least the portion of the capture-index information based on the containment type includes selecting at least one of the HACI or the CACI.

17. The non-transitory computer-readable medium of claim 16, wherein the instructions further instruct the at least one processor to determine the cooling-performance assessment based on a greater of the CACI and the HACI responsive to determining that the containment type is an uncontained type.

18. The non-transitory computer-readable medium of claim 16, wherein the instructions further instruct the at least one processor to determine the cooling-performance assessment based on a lesser of the CACI and the HACI responsive to determining that the containment type is a hot-and-cold-aisle containment type.

19. The non-transitory computer-readable medium of claim 16, wherein the instructions further instruct the at least one processor to:

determine the cooling-performance assessment based on the HACI responsive to determining that the containment type is a hot-aisle containment type; and determine the cooling-performance assessment based on the CACI responsive to determining that the containment type is a cold-aisle containment type.

20. A method for assessing a space containing a plurality of information-technology devices, the method comprising:

receiving information-technology-device information indicative of the plurality of information-technology devices in the space, the information-technology-device information including information-technology-device-location information, temperature information, and capture-index information;

determining, based on the information-technology-device information, a containment type of the plurality of information-technology devices;

selecting, based on the containment type, at least a portion of the capture-index information;

determining, based on the information-technology-device-location information, the temperature information, and the at least the portion of the capture-index information, a respective cooling-performance assessment for each information-technology device of the plurality of information-technology devices in the space; and displaying an indicator of the respective cooling-performance assessment for each information-technology device of the plurality of information-technology devices in the space.

21. The method of claim 20, wherein the capture-index information includes at least one of a cold-aisle capture index (CACI) or a hot-aisle capture index (HACI), and wherein selecting the at least the portion of the capture-index information based on the containment type includes selecting at least one of the HACI or the CACI.

* * * * *